United States Patent
Wang et al.

(10) Patent No.: US 11,728,177 B2
(45) Date of Patent: Aug. 15, 2023

(54) SYSTEMS AND METHODS FOR NITRIDE-CONTAINING FILM REMOVAL

(71) Applicant: Applied Materials, Inc., Santa Clara, CA (US)

(72) Inventors: Baiwei Wang, Milpitas, CA (US); Oliver Jan, Fremont, CA (US); Rohan Puligoru Reddy, San Jose, CA (US); Xiaolin Chen, San Ramon, CA (US); Zhenjiang Cui, San Jose, CA (US); Anchuan Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/173,329

(22) Filed: Feb. 11, 2021

(65) Prior Publication Data
US 2022/0254648 A1    Aug. 11, 2022

(51) Int. Cl.
*H01L 21/3213*    (2006.01)
*H01J 37/32*    (2006.01)
*H01L 21/3065*    (2006.01)
*H01L 21/02*    (2006.01)

(52) U.S. Cl.
CPC .. *H01L 21/32136* (2013.01); *H01J 37/32357* (2013.01); *H01L 21/02614* (2013.01); *H01L 21/3065* (2013.01); *H01L 21/30655* (2013.01); *H01J 2237/3341* (2013.01)

(58) Field of Classification Search
None
See application file for complete search history.

(56) References Cited

U.S. PATENT DOCUMENTS

| | | | |
|---|---|---|---|
| 7,618,894 B2 | 11/2009 | Bornstein et al. | |
| 10,727,080 B2 | 7/2020 | Wang et al. | |
| 2009/0162565 A1 | 6/2009 | Gonohe et al. | |
| 2011/0279979 A1 | 11/2011 | Mirin et al. | |
| 2015/0111315 A1 | 4/2015 | Grimbergen | |
| 2019/0214230 A1* | 7/2019 | Cui | H01L 21/32135 |
| 2019/0311909 A1* | 10/2019 | Bajaj | H01L 21/31116 |
| 2020/0075313 A1* | 3/2020 | Wang | H01J 37/32449 |

OTHER PUBLICATIONS

International Search Report and Written Opinion dated May 16, 2022 in International Patent Application No. PCT/US2022/014650, 8 pages.

* cited by examiner

*Primary Examiner* — Stephanie P Duclair
(74) *Attorney, Agent, or Firm* — Kilpatrick Townsend & Stockton LLP

(57) ABSTRACT

Exemplary etching methods may include flowing an oxygen-containing precursor into a remote plasma region of a semiconductor processing chamber while striking a plasma to produce oxygen plasma effluents. The methods may include contacting a substrate housed in a processing region with the oxygen plasma effluents. The substrate may define an exposed region of titanium nitride. The contacting may produce an oxidized surface on the titanium nitride. The methods may include flowing a halogen-containing precursor into a remote plasma region of a semiconductor processing chamber while striking a plasma to produce halogen plasma effluents. The methods may include contacting the oxidized surface on the titanium nitride with the halogen plasma effluents. The methods may include removing the oxidized surface on the titanium nitride.

20 Claims, 5 Drawing Sheets

SYSTEMS AND METHODS FOR NITRIDE-CONTAINING FILM REMOVAL

TECHNICAL FIELD

The present technology relates to semiconductor processes and equipment. More specifically, the present technology relates to selectively etching nitride-containing structures.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. For example, a wet etch may preferentially remove some oxide dielectrics over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary etching methods may include flowing an oxygen-containing precursor into a remote plasma region of a semiconductor processing chamber while striking a plasma to produce oxygen plasma effluents. The methods may include contacting a substrate housed in a processing region with the oxygen plasma effluents. The substrate may define an exposed region of titanium nitride. The contacting may produce an oxidized surface on the titanium nitride. The methods may include flowing a halogen-containing precursor into a remote plasma region of a semiconductor processing chamber while striking a plasma to produce halogen plasma effluents. The methods may include contacting the oxidized surface on the titanium nitride with the halogen plasma effluents. The methods may include removing the oxidized surface on the titanium nitride.

In some embodiments, the halogen-containing precursor may include fluorine or chlorine. The oxygen-containing precursor may be oxygen. The halogen-containing precursor may be or include nitrogen trifluoride. The methods may include flowing hydrogen with the halogen-containing precursor. A flow rate of the hydrogen may be at least twice a flow rate of the halogen-containing precursor. Contacting the substrate with the oxygen plasma effluents may be performed at a first temperature. Contacting the substrate with the halogen plasma effluents may be performed at a second temperature less than the first temperature. Contacting the substrate with the oxygen plasma effluents may be performed in a first processing chamber. Contacting the substrate with the halogen plasma effluents may be performed in a second processing chamber separate from the first processing chamber. A pressure within the semiconductor processing chamber may be maintained below or about 5 Torr while contacting the substrate with the oxygen plasma effluents. The methods may include increasing the pressure in the semiconductor processing chamber prior to contacting the oxidized surface on the titanium nitride with the halogen plasma effluents. The etching method may be performed for multiple cycles. The oxidized surface on the titanium nitride removed each cycle may be less than or about 1 nm. The etching method may be performed in a single processing chamber. The etching method may be performed while maintaining a substrate temperature of less than or about 300° C.

Some embodiments of the present technology may encompass etching methods. The methods may include contacting a substrate housed in a processing region of a semiconductor processing chamber with an oxygen-containing precursor. The substrate may define an exposed region of titanium nitride. The contacting may produce an oxidized surface on the titanium nitride limited to a depth of less than or about 1 nm. The methods may include halting the flow of the oxygen-containing precursor. The methods may include contacting the oxidized surface on the titanium nitride with a halogen-containing precursor. The methods may include removing the oxidized surface on the titanium nitride.

In some embodiments, the methods may include forming a plasma of one or both of the oxygen-containing precursor or the halogen-containing precursor prior to contacting the substrate. The halogen-containing precursor may include fluorine or chlorine. The halogen-containing precursor may be or include nitrogen trifluoride. The method may include flowing hydrogen with the halogen-containing precursor. A flow rate of the hydrogen may be at least twice a flow rate of the halogen-containing precursor. Contacting the substrate with the oxygen-containing precursor may be performed at a first temperature. Contacting the substrate with the halogen-containing precursor may be performed at a second temperature less than the first temperature. A pressure within the semiconductor processing chamber may be maintained below or about 5 Torr while contacting the substrate with the oxygen-containing precursor. The etching method may include increasing the pressure in the semiconductor processing chamber prior to contacting the oxidized surface on the titanium nitride with the halogen-containing precursor.

Some embodiments of the present technology may encompass etching methods. The methods may include producing oxygen plasma effluents in a semiconductor processing chamber. The methods may include contacting a substrate housed in a processing region with the oxygen plasma effluents. The substrate may define an exposed region of titanium nitride. The contacting may produce an oxidized surface on the titanium nitride. The methods may include halting a flow of the oxygen plasma effluents into the semiconductor processing chamber. The methods may include increasing a pressure within the processing region from a first pressure to a second pressure. The methods may include producing halogen plasma effluents in the semiconductor processing chamber. The methods may include contacting the oxidized surface on the titanium nitride with the halogen plasma effluents. The methods may include removing the oxidized surface on the titanium nitride. In some embodiments, contacting the substrate with the oxygen plasma effluents may be performed at a first temperature, and contacting the substrate with the halogen plasma effluents may be performed at a second temperature less than the first temperature. The second temperature may be less than or about 300° C.

Such technology may provide numerous benefits over conventional systems and techniques. For example, the processes may allow a precisely controlled dry etch to be performed that may protect a variety of materials on the substrate. Additionally, the processes may selectively remove titanium-containing films or tantalum-containing films relative to other exposed materials on the substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
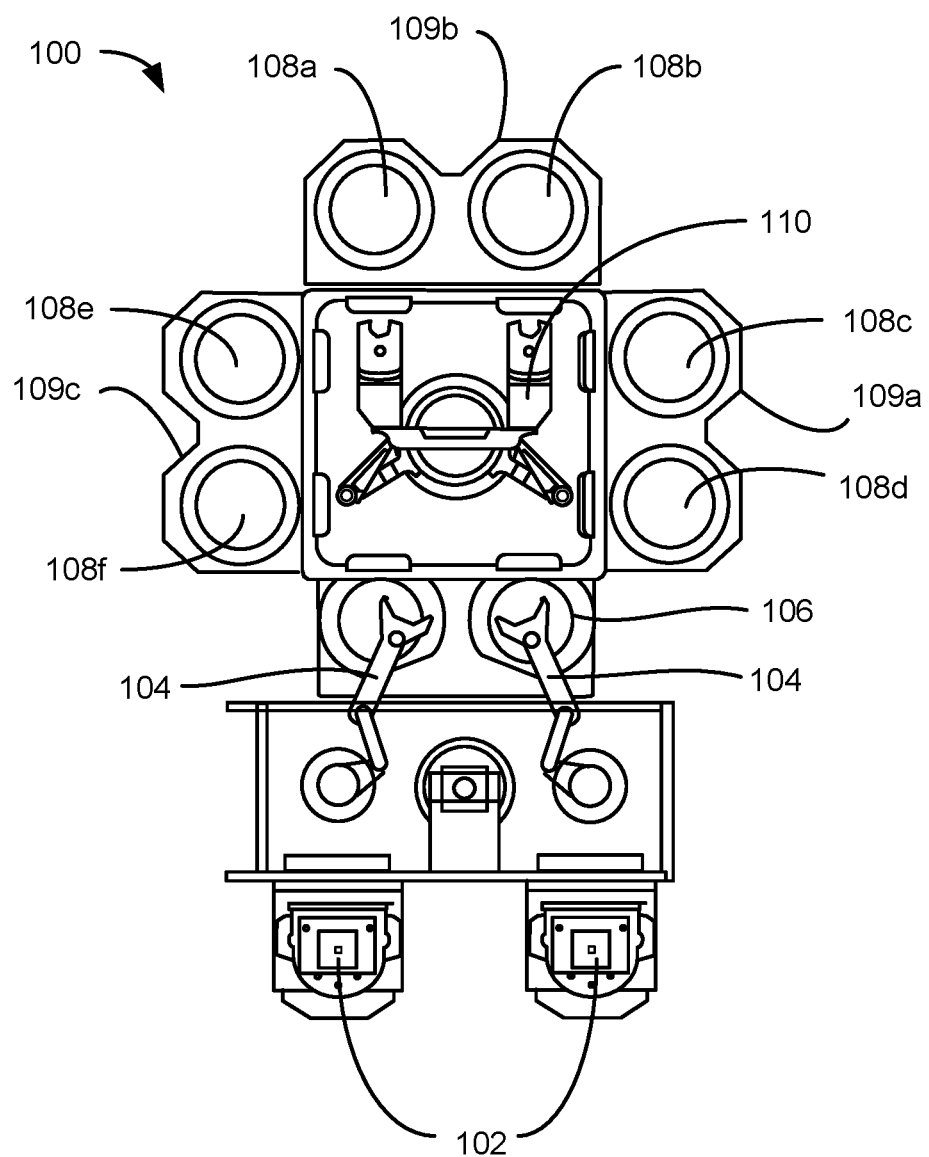
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include additional or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Selectively etching titanium nitride and tantalum nitride is beneficial in a variety of device process flows including in the formation of dynamic random access memory, FinFETs, and many other devices. The titanium or tantalum nitride may be employed as a barrier layer to inhibit diffusion while maintaining significant conductivity when combined with a conductor in the form of a line or via. Conventional processes utilizing halogen precursors or plasma products to etch titanium or tantalum nitride have typically been limited by the low etch rate of titanium or tantalum nitride with these materials, which may be limited to Angstrom-level etching over relatively longer periods of time. This may cause increased residence time of halogen materials, including plasma effluents, which may increase contact with exposed materials on the substrate that are sought to be maintained. The present technology overcomes these limitations by performing a selective etch process that initially oxidizes portions of the nitride prior to performing an etch process, which may more quickly remove the oxidized material. The etch may preferentially remove the oxidized material, which may facilitate a precisely controlled etch process that may be substantially limited per cycle to an amount of titanium or tantalum nitride that has been oxidized. The etch process may be selective relative to dielectric materials as well as metals and other materials on the substrate. Additionally, the present technology may facilitate the removal at lower temperatures than conventional techniques, which may allow the process to be performed with exposure of low-k or other limited thermal budget materials.

Although the remaining disclosure will routinely identify specific materials and semiconductor structures utilizing the disclosed technology, it will be readily understood that the systems, methods, and materials are equally applicable to a number of other structures that may benefit from aspects of the present technology. Accordingly, the technology should not be considered to be so limited as for use with any specific processes or materials alone. Moreover, although an exemplary chamber is described to provide foundation for the present technology, it is to be understood that the present technology can be applied to virtually any semiconductor processing chamber that may allow the operations described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including the dry etch processes described herein in addition to cyclical layer deposition, atomic layer deposition, chemical vapor deposition, physical vapor deposition, etch, pre-clean, degas, orientation, and other substrate processes.

The substrate processing chambers 108*a-f* may include one or more system components for depositing, annealing, curing and/or etching a dielectric film on the substrate wafer. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
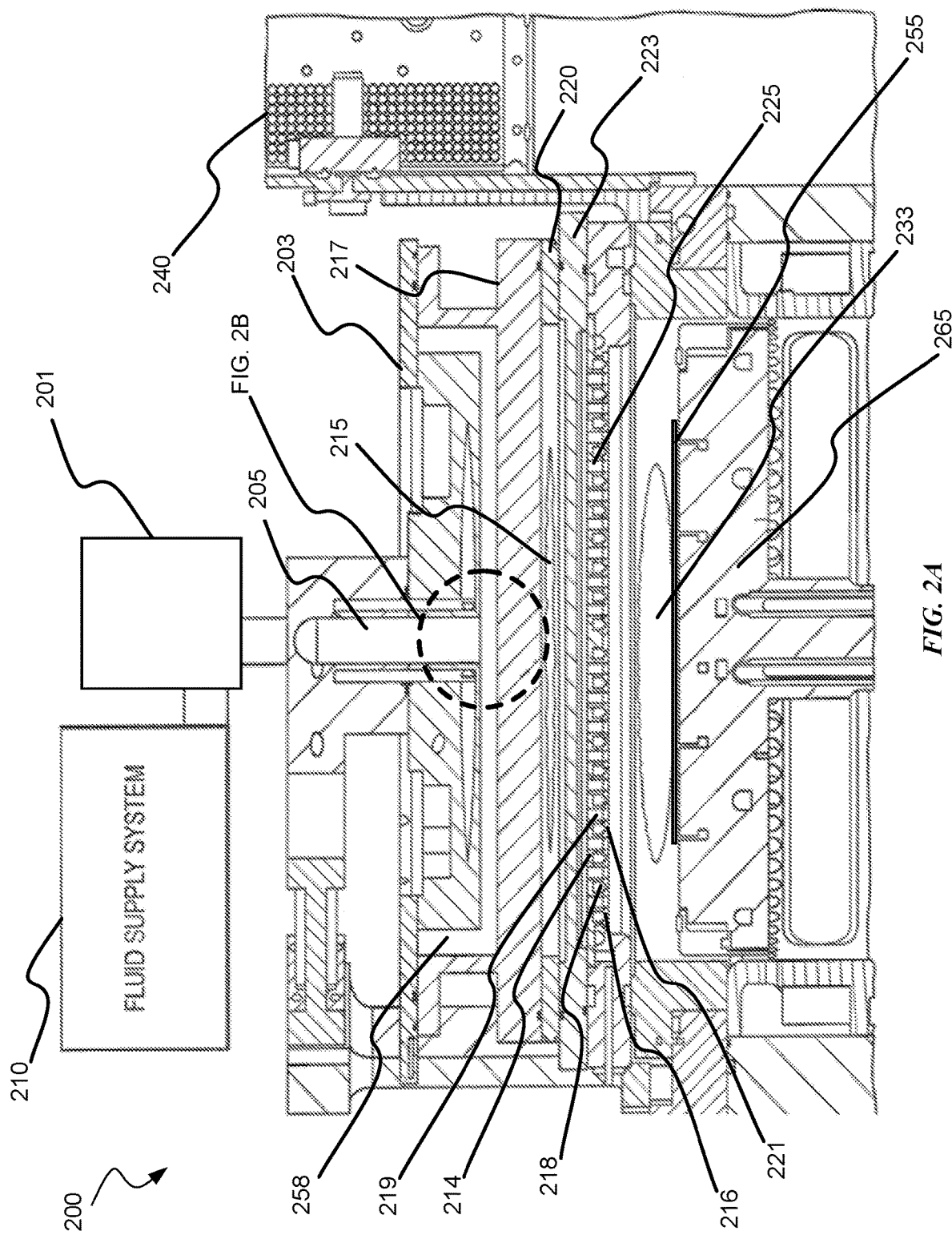
FIG. 2A shows a schematic cross-sectional view of an exemplary processing chamber according to some embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system 201 may optionally be included in the system, and may process a first gas which then travels through gas inlet assembly 205. The inlet assembly 205 may include two or more distinct gas supply channels where the second channel (not shown) may bypass the remote plasma system 201, if included.

A cooling plate 203, faceplate 217, ion suppressor 223, showerhead 225, and a pedestal 265 or substrate support, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may include aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the remote plasma system 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively-coupled plasma to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency ("RF") range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
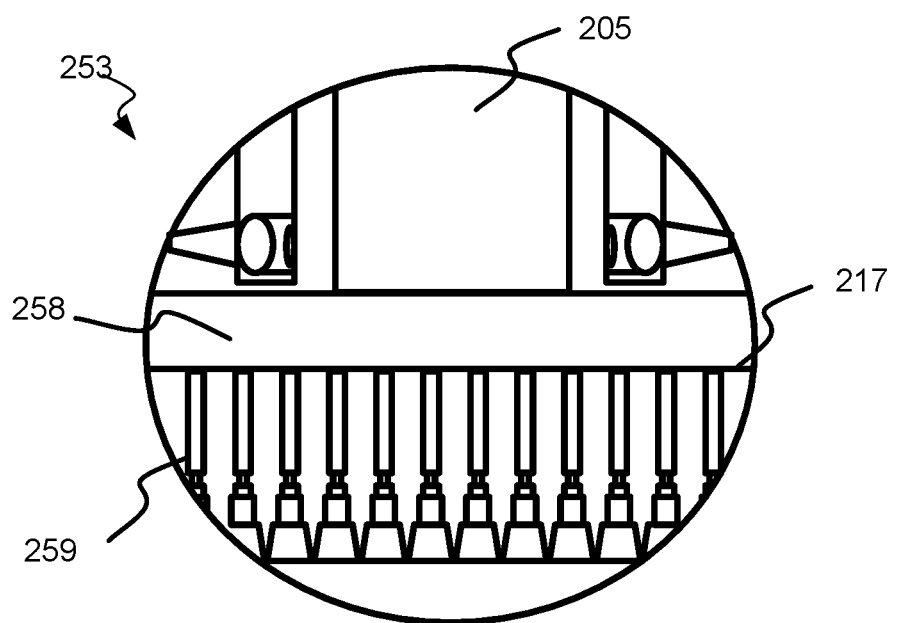
FIG. 2B shows a detailed view of a portion of the processing chamber illustrated in FIG. 2A according to some embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
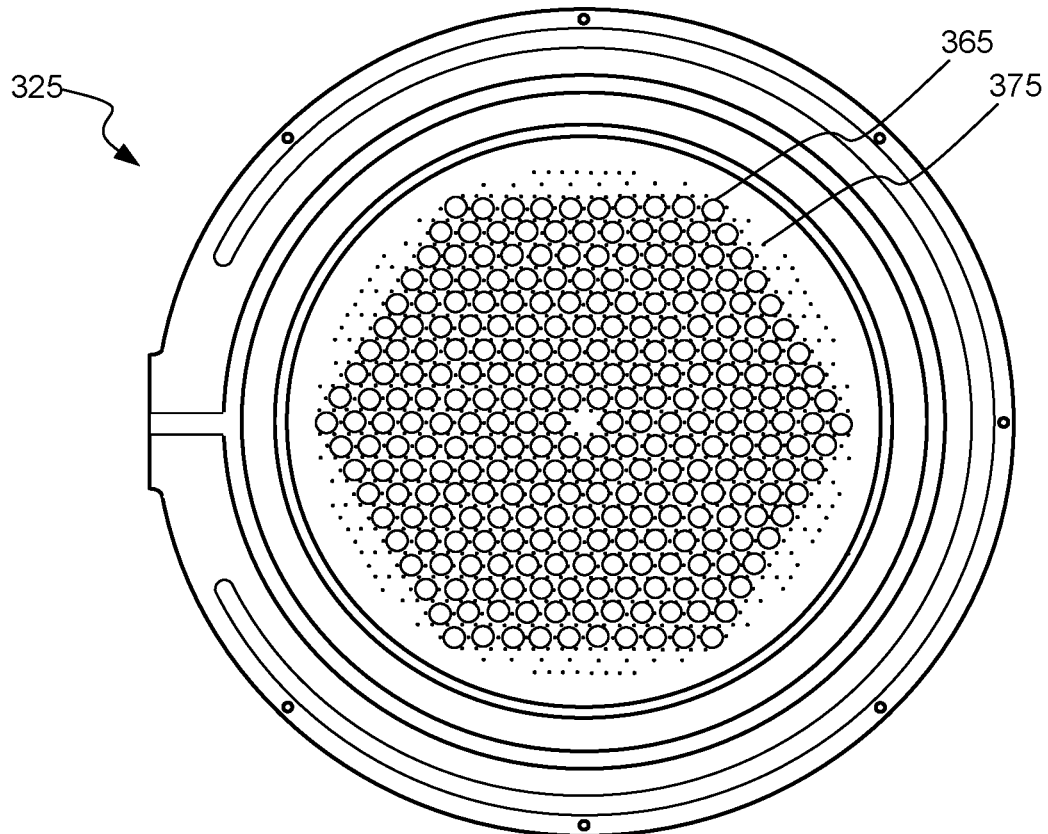
FIG. 3 shows a bottom plan view of an exemplary showerhead according to some embodiments of the present technology.

The gas distribution assemblies such as showerhead 225 for use in the processing chamber section 200 may be referred to as dual channel showerheads and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the showerhead 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
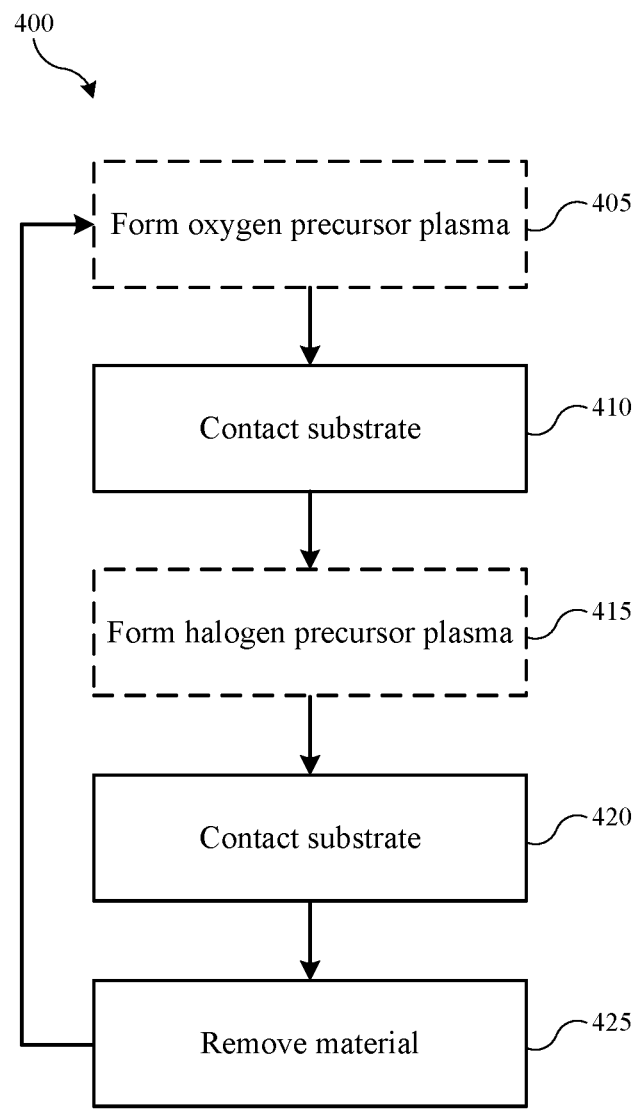
FIG. 4 shows exemplary operations in a method according to some embodiments of the present technology.

The chamber discussed previously may be used in performing exemplary methods, including etching methods. Turning to FIG. 4 is shown exemplary operations in a method 400 according to embodiments of the present technology. Method 400 may include one or more operations prior to the initiation of the method, including front end processing, deposition, etching, polishing, cleaning, or any other operations that may be performed prior to the described operations. The method may include a number of optional operations, which may or may not be specifically associated with some embodiments of methods according to embodiments of the present technology. For example, many of the operations are described in order to provide a broader scope of the processes performed, but are not critical to the technology, or may be performed by alternative methodology as will be discussed further below. Method 400 may describe operations shown schematically in FIGS. 5A-5B, the illustrations of which will be described in conjunction with the operations of method 400. It is to be understood that the figures illustrate only partial schematic views, and a substrate may contain any number of additional materials and features having a variety of characteristics and aspects as illustrated in the figures.

Figure 5A:
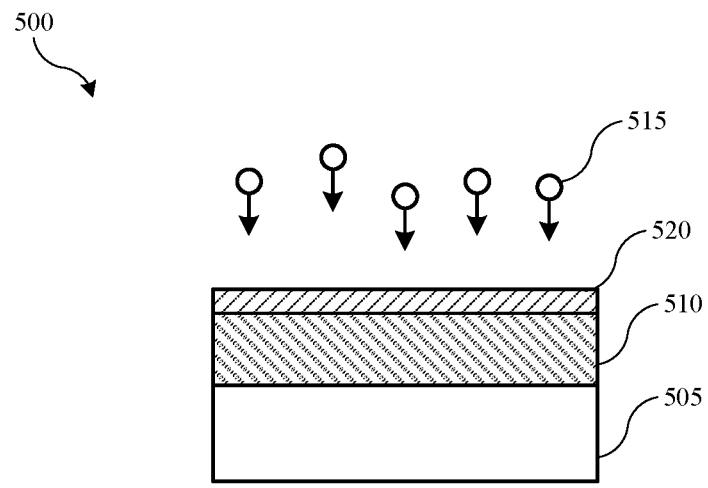
FIGS. 5A-5B show schematic cross-sectional views of materials etched according to some embodiments of the present technology.

Method 400 may or may not involve optional operations to develop the semiconductor structure to a particular fabrication operation. It is to be understood that method 400 may be performed on any number of semiconductor structures or substrates 505, as illustrated in FIG. 5A, including exemplary structures on which a titanium nitride or tantalum removal operation may be performed. Exemplary semiconductor structures may include a trench, via, or other recessed features that may include one or more exposed materials. For example, an exemplary substrate may contain silicon or some other semiconductor substrate material as well as interlayer dielectric materials through which a recess, trench, via, or isolation structure may be formed. Exposed materials at any time during the etch process may be or include metal materials, one or more dielectric materials, a contact material, a transistor material, or any other material that may be used in semiconductor processes.

For example, although shown as a generic layer, FIG. 5A may illustrate a layer of titanium nitride 510 overlying substrate 505 or some other semiconductor material. Although the remaining disclosure will reference titanium nitride, it is to be understood that the material 510 may also be tantalum nitride in embodiments of the present technology, and the process may involve removal of tantalum nitride with or alternatively to titanium nitride. Substrate 505 may illustrate a dielectric material overlying one or more other structures on a substrate, and it is to be understood that any number of materials may be formed beneath the structure illustrated. In some embodiments dielectric materials may be or include silicon oxide, or any other oxide or nitride through which patterning may occur. It is to be understood that the noted structure is not intended to be limiting, and any of a variety of other semiconductor structures including titanium-containing materials or other metal-containing materials are similarly encompassed. Other exemplary structures may include two-dimensional and three-dimensional structures common in semiconductor manufacturing, and within which a titanium-containing material such as titanium nitride is to be removed relative to one or more other materials, as the present technology may selectively remove titanium-containing materials relative to other exposed materials, such as silicon-containing materials, and any of the other materials discussed elsewhere. Additionally, although a high-aspect-ratio structure may benefit from the present technology, the technology may be equally applicable to lower aspect ratios and any other structures.

For example, layers of material according to the present technology may be characterized by any aspect ratios or the height-to-width ratio of the structure, although in some embodiments the materials may be characterized by larger aspect ratios, which may not allow sufficient etching utilizing conventional technology or methodology. For example, in some embodiments the aspect ratio of any layer of an exemplary structure may be greater than or about 10:1, greater than or about 20:1, greater than or about 30:1, greater than or about 40:1, greater than or about 50:1, or greater. Additionally, each layer may be characterized by a reduced width or thickness less than or about 100 nm, less than or about 80 nm, less than or about 60 nm, less than or about 50 nm, less than or about 40 nm, less than or about 30 nm, less than or about 20 nm, less than or about 10 nm, less than or about 5 nm, less than or about 1 nm, or less. This combination of high aspect ratios and minimal thicknesses may frustrate many conventional etching operations, or require substantially longer etch times to remove a layer, along a vertical or horizontal distance through a confined width. Moreover, damage to or removal of other exposed layers may occur with conventional technologies as previously explained.

Method 400 may be performed to remove an exposed titanium-containing material in embodiments, although any number of nitride or titanium-containing materials may be removed in any number of structures in embodiments of the present technology. The methods may include specific operations for the removal of titanium nitride. Although the remaining disclosure will routinely discuss titanium nitride, it is to be understood that other metal nitrides may similarly be processed by some embodiments of the present technology. In some embodiments, the methods may include a multiple-operation etch process, which may control etching of the titanium relative to other exposed materials, such as dielectric material, for example silicon oxide, and the underlying contact material, such as titanium or some other conductive material used in the structure.

Method 400 may include flowing an oxygen-containing precursor into a semiconductor processing chamber housing the described substrate. In some embodiments the oxygen-containing precursor may be flowed directly to contact the substrate, although in some embodiments a plasma may be formed of the oxygen-containing precursor at optional operation 405. The oxygen-containing precursor may be flowed through a remote plasma region of the processing chamber, such as region 215 described above, and a plasma may be formed of the oxygen-containing precursor to produce plasma effluents. Although a substrate-level plasma may be produced, in some embodiments the plasma may be a remote plasma, which may protect exposed substrate materials from ion bombardment that may occur due to the substrate-level plasma. Whether plasma-enhanced or not, at operation 410, the oxygen-containing precursor or plasma effluents of the oxygen-containing precursor may be delivered to the substrate processing region, where the effluents may contact the semiconductor substrate including an exposed titanium-containing material, such as an exposed region of titanium nitride. The contacting may produce an oxidized material, such as an oxidized surface on the titanium nitride or a titanium nitride oxide material, such as by converting the exposed titanium nitride on the substrate. In some embodiments, subsequent the oxidation, the plasma may be extinguished, and the chamber may be purged. As shown in FIG. 5A, oxygen material, or oxygen plasma effluents 515 may be flowed to contact the exposed titanium nitride material, which may convert an exposed surface of titanium nitride 510 into an oxidized titanium material 520, which may include aspects of oxygen, titanium, and nitrogen. Some portion of the nitrogen may also be outgassed as nitrous oxide, nitric oxide, or nitrogen dioxide.

Figure 5B:
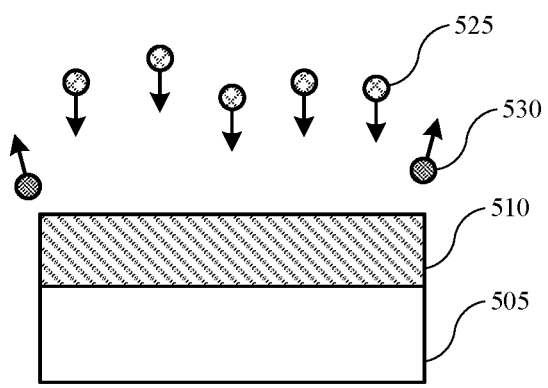

Subsequent the oxidation operation, the delivery of the oxygen material may be halted, and a halogen-containing precursor may be flowed into the processing region. Additionally, and as will be discussed further below, in some embodiments the substrate may be moved to a second processing chamber, such as on the mainframe or platform, which may maintain the substrate under vacuum. Once in the second processing chamber, the halogen-containing precursor may be delivered. Similarly to the oxygen-containing precursor, the halogen-containing precursor may be delivered directly to the processing region or may first be formed into a plasma at optional operation 415. The plasma may also be generated in a remote plasma region of the processing chamber in some embodiments of the present technology. The etchant precursor may interact with the oxidized portion of the titanium nitride to produce byproducts including ammonium, titanium, and a halogen, and which may be volatile under certain processing conditions, and may be evolved from the substrate. Accordingly, whether plasma enhanced or not, the halogen-containing precursor may contact the oxidized material at operation 420, which may etch or remove the oxidized region of the titanium nitride material from the underlying metal at operation 425. As illustrated in FIG. 5B, halogen-containing precursor or plasma effluents 525 may contact the oxidized portion and produce volatile byproducts 530, and which may remove the oxidized material from the titanium nitride material. By separating the oxidation and the etching operations, and by limiting or preventing interaction of the precursors or plasma effluents, a controlled removal process may be performed that ensures removal only to oxidized portions that may be controlled based on a penetration depth of the oxygen.

The halogen-containing precursor or plasma effluents may be halted, and the process may then be repeated in any number of cycles to remove additional layers of titanium nitride selectively relative to additional exposed materials. Based on a plasma power and process conditions, the oxidation may be limited to a depth of the titanium nitride of less than or about 10 Å, and may be limited to a depth of less than or about 9 Å, less than or about 8 Å, less than or about 7 Å, less than or about 6 Å, less than or about 5 Å, less than or about 4 Å, less than or about 3 Å, less than or about 2 Å, or less. Once an oxide layer has been produced, no further oxidation may occur. This may then limit the subsequent etch to substantially halt after the oxidized portion has been removed, which may provide precise control over the depth at which the titanium nitride is removed, and which may allow controlled thinning and removal without damaging underlying materials as a substantially self-limiting etch process. Accordingly, techniques according to aspects of the present technology may be performed to remove titanium nitride from narrow features, as well as high aspect ratio features, and thin dimensions that may otherwise be unsuitable for wet etching or reactive ion etching.

The precursors during each of the two-step operation may include oxygen-containing precursors, which may include any oxygen-containing materials in some embodiments. For example, non-limiting oxygen-containing precursors may include diatomic oxygen, ozone, water, an alcohol, hydrogen peroxide, nitrous oxide, or any other oxygen-containing material. Exemplary halogen-containing precursors may include one or more of fluorine or chlorine in some embodiments, as well as any other halogen. Some exemplary precursors that may be utilized as the first precursor may include halides including hydrogen fluoride, nitrogen trifluoride, or any organofluoride, diatomic fluorine, bromine trifluoride, chlorine trifluoride, sulfur hexafluoride, xenon difluoride, boron trichloride, tungsten pentachloride, tungsten hexachloride, diatomic chlorine, or any other chlorine-containing or fluorine-containing precursor. The precursors may also be flown together in a variety of combinations. The precursors may also be flowed with any number of additional precursors or carrier gases including diatomic hydrogen, or a hydrogen-containing precursor, nitrogen, argon, helium, or any number of additional materials, although in some embodiments the precursors may be limited to control side reactions or other aspects that may impact selectivity.

Processing conditions may impact and facilitate etching according to the present technology. For example, the temperature at which the operations are performed may impact the extent to which the reaction may occur. During the oxidation of the titanium nitride surface, elevated temperature may facilitate the reaction, and may allow a plasma-free reaction to be performed, which may further protect other exposed materials from bombardment or interaction with oxygen radicals. Accordingly, in some embodiments of the present technology, the contact operation with the oxygen precursor or oxygen plasma effluents may be performed at substrate, pedestal, and/or chamber temperatures above or about 200° C., and may be performed at temperatures above or about 250° C., above or about 300° C., above or about 350° C., above or about 400° C., above or about 450° C., or higher depending on a thermal budget of materials on the substrate. The temperature may also be maintained at any temperature within these ranges, within smaller ranges encompassed by these ranges, or between any of these ranges.

In some embodiments the contact operation with the halogen precursor or halogen plasma effluents may be performed at the same or different temperature than the contact operation with the oxygen. The contact operation with the halogen may also be plasma enhanced or plasma free in embodiments, such as depending on the halogen precursor utilized. Regardless, the interaction may be controlled in some embodiments by lowering the temperature of the substrate, although the temperature may be higher during the halogen contact operation as well. Because of the thermal mass of the substrate support, in some embodiments the contact operation with the halogen precursor or plasma effluents may be performed in a separate processing chamber to allow different temperatures to be used. The separate chamber may still be on the same platform, which may allow the substrate to be maintained at vacuum conditions throughout the process. In many processes to remove titanium nitride with halogen-containing materials without oxidation, the temperature may be maintained greater than 300° C., or the reaction may cease to proceed. However, by performing a controlled oxidation according to embodiments of the present technology, the contact operation and removal may be performed at temperatures of less than or about 300° C., and may be performed at temperatures of less than or about 290° C., less than or about 280° C., less than or about 270° C., less than or about 260° C., less than or about 250° C., less than or about 240° C., less than or about 230° C., less than or about 220° C., less than or about 210° C., less than or about 200° C., or less.

The pressure within the chamber may also affect the operations performed as well as affect at what temperature the byproducts may evolve from the titanium nitride surface. To facilitate the oxidation, which may be based on plasma-enhanced precursors, a processing pressure may be lower than in the second removal operation utilizing the halogen-containing precursor. By maintaining a lower pressure in the first operation, such as during use of the oxygen precursor or oxygen plasma effluents, increased interaction at the substrate surface may be facilitated. The lower pressure in the first portion of the method may increase the mean-free path between atoms, which may increase energy and interaction at the film surface. By utilizing a higher pressure in the second portion of the method, such as during use of the halogen precursor or plasma effluents, etch rate may be increased, which may increase selectivity by limiting residence time of the halogen materials within the processing region and in contact with other exposed materials.

Accordingly, in some embodiments the pressure may be maintained below about 5 Torr during the oxidation, such as during operations 405-410, and the pressure may be maintained below or about 4 Torr, below or about 3 Torr, below or about 2 Torr, below or about 1 Torr, below or about 0.5 Torr, or less. The pressure may then be increased during the second portion of the method, such as during operations 415-420, where the pressure may be maintained at a pressure of greater than or about 1 Torr, and may be maintained at greater than or about 2 Torr, greater than or about 3 Torr, greater than or about 4 Torr, greater than or about 5 Torr, greater than or about 6 Torr, greater than or about 7 Torr, greater than or about 8 Torr, greater than or about 9 Torr, greater than or about 10 Torr, or higher. The pressure may also be maintained at any pressure within these ranges, within smaller ranges encompassed by these ranges, or between any of these ranges.

When plasma effluents are utilized during one or both of the operations, plasma power may be maintained at less than about 500 W. By maintaining a lower plasma power, sputtering may be controlled, and interactions may be limited to superficial chemical reactions, which may better limit the extent of oxidation and/or etching through the titanium nitride. Consequently, in some embodiments the plasma power may be maintained at less than or about 450 W, less than or about 400 W, less than or about 350 W, less than or about 300 W, less than or about 250 W, less than or about 200 W, less than or about 150 W, less than or about 100 W, or less.

As noted previously, in some embodiments hydrogen may be delivered with the halogen precursor. By including hydrogen, etch rates of materials from fluorine or chlorine may be reduced or suppressed, which may provide further control on the extent of removal. Additionally, as underlying materials may at least partially etch in contact with fluorine or chlorine radicals, for example, increasing the dilution may further inhibit reaction with underlying materials. To protect additionally exposed materials, as well as to protect the titanium nitride underlying the oxidized material, hydrogen may be delivered at a flow rate greater than the flow rate of the halogen-containing precursor. For example, in some embodiments in which the halogen-containing precursor may be nitrogen trifluoride or any other halogen-containing material, a flow rate ratio of hydrogen to the halogen material may be greater than or about 1.5:1, and a flow rate ratio of hydrogen to the halogen material may be greater than or about 2.0:1, greater than or about 2.5:1, greater than or about 3.0:1, greater than or about 3.5:1, greater than or about 4.0:1, greater than or about 4.5:1, greater than or about 5.0:1, greater than or about 10.0:1, or higher. The hydrogen radicals may also help passivate other exposed materials while fluorine and/or chlorine interacts with the oxidized material.

Adding further control to the etch process, the halogen-containing precursor may be pulsed in some embodiments, and may be delivered throughout the etch process either continually or in a series of pulses, which may be consistent or varying over time. The pulsed delivery may be characterized by a first period of time during which the halogen-containing precursor is flowed, and a second period of time during which the halogen-containing precursor is paused or halted. The time periods for any pulsing operation may be similar or different from one another with either time period being longer. In embodiments either period of time or a continuous flow of precursor may be performed for a time period greater than or about 1 second, and may be greater than or about 2 seconds, greater than or about 3 seconds, greater than or about 4 seconds, greater than or about 5 seconds, greater than or about 6 seconds, greater than or about 7 seconds, greater than or about 8 seconds, greater than or about 9 seconds, greater than or about 10 seconds, greater than or about 11 seconds, greater than or about 12 seconds, greater than or about 13 seconds, greater than or about 14 seconds, greater than or about 15 seconds, greater than or about 20 seconds, greater than or about 30 seconds, greater than or about 45 seconds, greater than or about 60 seconds, or longer. The times may also be any smaller range encompassed by any of these ranges. In some embodiments as delivery of the precursor occurs for longer periods of time, etch rate may increase.

By performing operations according to embodiments of the present technology, titanium nitride may be etched selectively relative to other materials, including other oxides, nitrides, or exposed metal materials. For example, the present technology may selectively etch titanium nitride relative to exposed regions of metals, dielectrics including silicon-containing materials such as silicon oxide, or other materials. Embodiments of the present technology may etch titanium nitride or other metal nitrides relative to silicon oxide, silicon nitride, titanium, or any of the other materials at a rate of at least about 100:1, and may etch titanium nitride relative to silicon oxide, silicon nitride, titanium, or any of the other materials noted previously at a selectivity greater than or about 200:1, greater than or about 300:1, or more. For example, etching performed according to some embodiments of the present technology may etch titanium nitride while substantially or essentially maintaining silicon oxide, silicon nitride, titanium, or other materials. By performing etch operations according to embodiments of the present technology, substantially self-limiting removal operations may be performed to precisely remove titanium nitride, and which may be performed at lower temperatures than conventional removal to protect thermal budget constraints.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An etching method comprising:
   flowing an oxygen-containing precursor into a remote plasma region of a semiconductor processing chamber while striking a plasma to produce oxygen plasma effluents;
   contacting a substrate housed in a processing region with the oxygen plasma effluents, wherein the substrate defines an exposed region of titanium nitride or tantalum nitride, wherein the contacting produces an oxidized surface on the titanium nitride or tantalum nitride, and wherein the oxidized surface is characterized by a depth of less than 1 nm, and wherein a pressure within the semiconductor processing chamber is maintained below 5 Torr while contacting the substrate with the oxygen plasma effluents;
   flowing a halogen-containing precursor into a remote plasma region of a semiconductor processing chamber while striking a plasma to produce halogen plasma effluents;
   contacting the oxidized surface on the titanium nitride or tantalum nitride with the halogen plasma effluents, wherein a pressure within the semiconductor processing chamber is maintained above 5 Torr while contacting the substrate with the halogen plasma effluents; and
   removing the oxidized surface on the titanium nitride or tantalum nitride.

2. The etching method of claim 1, wherein the halogen-containing precursor comprises fluorine or chlorine.

3. The etching method of claim 2, wherein the oxygen-containing precursor is oxygen, wherein the halogen-containing precursor comprises nitrogen trifluoride, and wherein the method further comprises:

flowing hydrogen with the halogen-containing precursor.

4. The etching method of claim 3, wherein a flow rate of the hydrogen is at least twice a flow rate of the halogen-containing precursor.

5. The etching method of claim 1, wherein contacting the substrate with the oxygen plasma effluents is performed at a first temperature, and wherein contacting the substrate with the halogen plasma effluents is performed at a second temperature less than the first temperature.

6. The etching method of claim 5, wherein contacting the substrate with the oxygen plasma effluents is performed in a first processing chamber, and wherein contacting the substrate with the halogen plasma effluents is performed in a second processing chamber separate from the first processing chamber.

7. The etching method of claim 1, further comprising:
increasing the pressure in the semiconductor processing chamber prior to contacting the oxidized surface on the titanium nitride with the halogen plasma effluents.

8. The etching method claim 1, wherein the etching method is performed for multiple cycles.

9. The etching method claim 8, wherein the oxidized surface on the titanium nitride or tantalum nitride removed each cycle is less than or about 8 Å.

10. The etching method of claim 1, wherein the etching method is performed in a single processing chamber, and wherein the etching method is performed while maintaining a substrate temperature of less than or about 300° C.

11. The etching method of claim 1, wherein a plasma power to produce oxygen plasma effluents, halogen plasma effluents, or both is maintained at less than about 500 W.

12. An etching method comprising:
contacting a substrate housed in a processing region of a semiconductor processing chamber with an oxygen-containing precursor, wherein the substrate defines an exposed region of titanium nitride, wherein the contacting produces an oxidized surface on the titanium nitride limited to a depth of less than 1 nm, wherein contacting the substrate with the oxygen-containing precursor is performed at a first temperature, and wherein a pressure within the semiconductor processing chamber is maintained below 5 Torr while contacting the substrate with the oxygen-containing precursor;
halting flow of the oxygen-containing precursor;
contacting the oxidized surface on the titanium nitride with a halogen-containing precursor, wherein contacting the substrate with the halogen-containing precursor is performed at a second temperature less than the first temperature; and
removing the oxidized surface on the titanium nitride.

13. The etching method of claim 12, further comprising:
forming a plasma of one or both of the oxygen-containing precursor or the halogen-containing precursor prior to contacting the substrate.

14. The etching method of claim 12, wherein the halogen-containing precursor comprises fluorine or chlorine.

15. The etching method of claim 14, wherein the halogen-containing precursor comprises nitrogen trifluoride, the method further comprising:
flowing hydrogen with the halogen-containing precursor.

16. The etching method of claim 15, wherein a flow rate of the hydrogen is at least twice a flow rate of the halogen-containing precursor.

17. The etching method of claim 12, wherein a pressure within the semiconductor processing chamber is maintained below or about 5 Torr while contacting the substrate with the oxygen-containing precursor, the etching method further comprising:
increasing the pressure in the semiconductor processing chamber prior to contacting the oxidized surface on the titanium nitride with the halogen-containing precursor.

18. The etching method of claim 12, wherein the second temperature is less than or about 200° C.

19. An etching method comprising:
producing oxygen plasma effluents in a semiconductor processing chamber;
contacting a substrate housed in a processing region with the oxygen plasma effluents, wherein the substrate defines an exposed region of titanium nitride, and wherein the contacting produces an oxidized surface on the titanium nitride, wherein the oxidized surface is characterized by a depth of less than 1 nm, and wherein a pressure within the semiconductor processing chamber is maintained below 5 Torr while contacting the substrate with the oxygen plasma effluents;
halting a flow of the oxygen plasma effluents into the semiconductor processing chamber;
increasing a pressure within the processing region from a first pressure to a second pressure;
producing halogen plasma effluents in the semiconductor processing chamber;
contacting the oxidized surface on the titanium nitride with the halogen plasma effluents; and
removing the oxidized surface on the titanium nitride.

20. The etching method of claim 19, wherein contacting the substrate with the oxygen plasma effluents is performed at a first temperature, wherein contacting the substrate with the halogen plasma effluents is performed at a second temperature less than the first temperature, and wherein the second temperature is less than or about 300° C.

* * * * *